United States Patent
Fujita et al.

(10) Patent No.: US 10,574,228 B2
(45) Date of Patent: Feb. 25, 2020

(54) SIGNAL MULTIPLEXER

(71) Applicant: THINE ELECTRONICS, INC., Tokyo (JP)

(72) Inventors: Yusuke Fujita, Tokyo (JP); Satoshi Miura, Tokyo (JP); Shunichi Kubo, Tokyo (JP)

(73) Assignee: THINE ELECTRONICS, INC., Tokyo (JP)

(*) Notice: Subject to any disclaimer, the term of this patent is extended or adjusted under 35 U.S.C. 154(b) by 213 days.

(21) Appl. No.: 15/103,387

(22) PCT Filed: Nov. 14, 2014

(86) PCT No.: PCT/JP2014/080217
§ 371 (c)(1),
(2) Date: Jun. 10, 2016

(87) PCT Pub. No.: WO2015/087658
PCT Pub. Date: Jun. 18, 2015

(65) Prior Publication Data
US 2016/0308522 A1 Oct. 20, 2016

(30) Foreign Application Priority Data

Dec. 12, 2013 (JP) .................................. 2013-256794

(51) Int. Cl.
H03K 17/16 (2006.01)
H03K 17/693 (2006.01)
(Continued)

(52) U.S. Cl.
CPC ......... H03K 17/162 (2013.01); H03K 17/693 (2013.01); H03K 19/00 (2013.01);
(Continued)

(58) Field of Classification Search
CPC .......................... H03K 17/162; H03K 17/697
See application file for complete search history.

(56) References Cited

U.S. PATENT DOCUMENTS 5,701,095 A * 12/1997 Ohsawa ............... G11C 7/1048
326/121
7,031,349 B1 * 4/2006 Seifert ................. H03K 17/162
370/537
(Continued)

FOREIGN PATENT DOCUMENTS

CN 102292915 A 12/2011
CN 102646388 A 8/2012
(Continued)

OTHER PUBLICATIONS

International Preliminary Report on Patentability dated Jun. 23, 2016 from the International Bureau in counterpart International Application No. PCT/JP2014/080217.
(Continued)

*Primary Examiner* — Lincoln D Donovan
*Assistant Examiner* — Colleen J O Toole
(74) *Attorney, Agent, or Firm* — Sughrue Mion, PLLC (57) ABSTRACT

The signal multiplexer 1 inputs two selection signals CLK<1>, CLK<2> that sequentially reach significant levels, inputs two input signals IN<1>, IN<2>, and outputs, from an output terminal 14, a signal OUT that depends on an m-th input signal IN<m> of the two input signals when an m-th selection signal CLK<m> of the two selection signals is at the significant level. The signal multiplexer 1 includes a resistance unit 20 and two drive units $30_1$, $30_2$. Each of the drive units $30_m$ includes a driving switch $31_m$, a selecting switch $32_m$, and a potential stabilizing switch $33_m$. When
(Continued)

one of the selecting switch $32_m$ and the potential stabilizing switch $33_m$ in each of the drive units $30_m$ is in a closed state, the other is in an open state.

5 Claims, 9 Drawing Sheets

(51) Int. Cl.
*H03K 19/00* (2006.01)
*H03K 19/173* (2006.01)
*H04J 3/04* (2006.01)

(52) U.S. Cl.
CPC ..... *H03K 19/1733* (2013.01); *H03K 19/1737* (2013.01); *H04J 3/047* (2013.01)

(56) References Cited

U.S. PATENT DOCUMENTS

| | | | |
|---|---|---|---|
| 7,609,799 | B2 | 10/2009 | Li |
| 7,899,145 | B2 | 3/2011 | Li |
| 8,290,109 | B2 | 10/2012 | Li |
| 8,493,257 | B2 | 7/2013 | Nagatani et al. |
| 9,093,030 | B2 | 7/2015 | Liang et al. |
| 2007/0053475 | A1 | 3/2007 | Li |
| 2010/0026345 | A1 | 2/2010 | Li |
| 2011/0176647 | A1 | 7/2011 | Li |
| 2011/0273317 | A1 | 11/2011 | Nagatani et al. |
| 2012/0306398 | A1 | 12/2012 | Liang et al. |

FOREIGN PATENT DOCUMENTS

| | | |
|---|---|---|
| CN | 102779481 A | 11/2012 |
| CN | 102377432 A | 3/2014 |
| JP | 11-136112 A | 5/1999 |
| JP | 11-205268 A | 7/1999 |
| JP | 2009-507425 A | 2/2009 |
| JP | 2012-114610 A | 6/2012 |
| WO | 2007027833 A2 | 3/2007 |

OTHER PUBLICATIONS

International Search Report of PCT/JP2014/080217 dated Feb. 10, 2015.

Chinese Office Action dated Sep. 20, 2017, from the Chinese counterpart application No. 201480067100.4.

\* cited by examiner

SIGNAL MULTIPLEXER

CROSS REFERENCE TO RELATED APPLICATIONS

This application is a National Stage of International Application No. PCT/JP2014/080217 filed Nov. 14, 2014, claiming priority based on Japanese Patent Application No. 2013-256794, filed Dec. 12, 2013, the contents of all of which are incorporated herein by reference in their entirety.

TECHNICAL FIELD

The present invention relates to a signal multiplexer that multiplexes and outputs a plurality of input signals.

BACKGROUND ART

A signal multiplexer can transmit a signal using a few signal lines by multiplexing and outputting a plurality of input signals. Known examples of the signal multiplexer are described in, for example, Patent Literatures 1 and 2.

CITATION LIST

Patent Literatures

Patent Literature 1: Japanese Unexamined Patent Publication No. H11-205268
Patent Literature 2: Japanese Unexamined Patent Publication No. 2009-507425

SUMMARY OF INVENTION

Technical Problem

The present inventor has found that power supply noise occurs in a signal multiplexer in accordance with a waveform pattern of an input signal, and jitter occurs in a waveform of an output signal. The present invention has been made to resolve the above-mentioned problem, and an object thereof is to provide a signal multiplexer capable of reducing jitter in an output signal waveform.

Solution to Problem

A signal multiplexer according to the present invention inputs M selection signals that sequentially reach significant levels, inputs M input signals, and outputs a signal that depends on an m-th input signal of the M input signals when an m-th selection signal of the M selection signals is at the significant level, the signal multiplexer including: a first terminal to which a first reference potential is applied; a second terminal to which a second reference potential that is different from the first reference potential is applied; a third terminal to which a third reference potential is applied; a resistance unit provided between the first terminal and an output terminal and having a resistance component; and M drive units provided in parallel between the second terminal and the output terminal. Furthermore, each m-th drive unit of the M drive units includes: a driving switch that opens and closes in accordance with a level of the m-th input signal of the M selection signals; a selecting switch that is in a closed state when the m-th selection signal of the M input signals is at the significant level; and a potential stabilizing switch that is in a closed state when the m-th selection signal is at an insignificant level. One of the driving switch and the selecting switch is provided between the output terminal and an intermediate node, and the other is provided between the second terminal and the intermediate node. The potential stabilizing switch is provided between the third terminal and the intermediate node. In this case, M is an integer of two or more, and m is each integer of one or more to M or less.

Preferably, the signal multiplexer according to the present invention includes two sets of the resistance unit and the M drive units, wherein the signal multiplexer inputs, as a common signal, an m-th selection signal that is input to the m-th drive unit of a first set of the two sets and an m-th selection signal that is input to the m-th drive unit of a second set, the signal multiplexer inputs, as a differential signal, an m-th input signal that is input to the m-th drive unit of the first set and an m-th input signal that is input to the m-th drive unit of the second set, and the signal multiplexer outputs, as a differential signal, a signal that is output from the output terminal of the first set and a signal that is output from the output terminal of the second set. In this case, the selecting switch of the m-th drive unit of the first set and the selecting switch of the m-th drive unit of the second set are preferably a common selecting switch. In addition, the potential stabilizing switch of the m-th drive unit of the first set and the potential stabilizing switch of the m-th drive unit of the second set are preferably a common potential stabilizing switch.

Advantageous Effects of Invention

According to the present invention, jitter in an output signal waveform in a signal multiplexer can be reduced.

DESCRIPTION OF EMBODIMENTS

Hereinafter, embodiments for practicing the present invention will be described in detail with reference to the accompanying drawings. In the description of the drawings, identical elements are denoted by the same reference signs, and overlapped descriptions are omitted.

Figure 1:
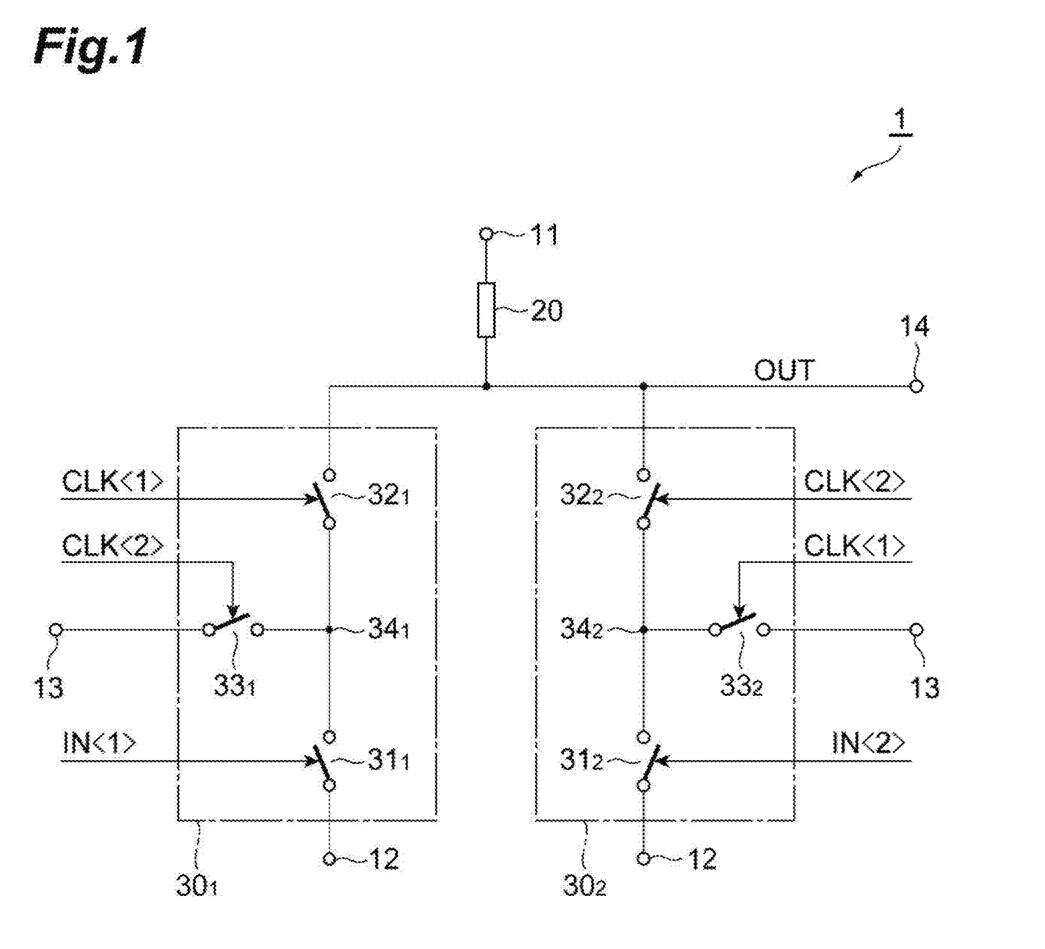
FIG. 1 is a diagram illustrating a configuration of a signal multiplexer 1 according to a first embodiment.

FIG. 1 is a diagram illustrating a configuration of a signal multiplexer 1 according to a first embodiment. The signal multiplexer 1 inputs two selection signals CLK<1>, CLK<2> that sequentially reach significant levels, inputs two input signals IN<1>, IN<2>, and outputs, from an output terminal 14, a signal OUT that depends on an m-th input signal IN<m> of the two input signals when an m-th selection signal CLK<m> of the two selection signals is at the significant level. In this case, m is one or two.

The signal multiplexer 1 includes a first terminal 11, a second terminal 12, a third terminal 13, a resistance unit 20, and two drive units $30_1$, $30_2$. A first reference potential is applied to the first terminal 11. A second reference potential is applied to the second terminal 12. A third reference potential is applied to the third terminal 13. The first reference potential and the second reference potential are different from each other. For example, one of the first reference potential and the second reference potential is a power supply potential, and the other is a ground potential. The third reference potential may be the same as any of the first reference potential and the second reference potential, or may be different from any of the first reference potential and the second reference potential.

The resistance unit 20 has at least a resistance component, and is provided between the first terminal 11 and the output terminal 14. The two drive units $30_1$, $30_2$ have a common configuration, and are provided in parallel between the second terminal 12 and the output terminal 14. The common second reference potential is applied to the second terminal 12 of each of the drive units $30_1$, $30_2$. Similarly, the common third reference potential is applied to the third terminal 13 of each of the drive units $30_1$, $30_2$.

Each of the drive units $30_m$ includes a driving switch $31_m$, a selecting switch $32_m$, and a potential stabilizing switch $33_m$. The driving switch $31_m$ of each of the drive units $30_m$ opens and closes in accordance with a level of the m-th input signal IN<m>. The driving switch $31_m$ of each of the drive units $30_m$ may be in a closed state when the m-th input signal IN<m> is at a high level, or may be in a closed state when the m-th input signal IN<m> is at a low level. The selecting switch $32_m$ of each of the drive units $30_m$ is in a closed state when the m-th selection signal CLK<m> is at the significant level.

The potential stabilizing switch $33_m$ of each of the drive units $30_m$ is in a closed state when the m-th selection signal CLK<m> is at an insignificant level. In other words, when one of the selecting switch $32_m$ and the potential stabilizing switch $33_m$ in each of the drive units $30_m$ is in the closed state, the other is in an open state. When M=2 is satisfied, the second selection signal CLK<2> (i.e. an inversion signal of the first selection signal CLK<1>) may be input to the first potential stabilizing switch $33_1$, and the first selection signal CLK<1> (i.e. an inversion signal of the second selection signal CLK<2>) may be input to the second potential stabilizing switch $33_2$.

One of the driving switch $31_m$ and the selecting switch $32_m$ is provided between the output terminal 14 and an intermediate node $34_m$, and the other is provided between the second terminal 12 and the intermediate node $34_m$. The potential stabilizing switch $33_m$ is provided between the third terminal 13 and the intermediate node $34_m$. The intermediate node $34_m$ is a common node for the driving switch $31_m$, the selecting switch $32_m$, and the potential stabilizing switch $33_m$. In FIG. 1, the selecting switch $32_m$ is provided between the output terminal 14 and the intermediate node $34_m$, and the driving switch $31_m$ is provided between the second terminal 12 and the intermediate node $34_m$.

Each of the driving switch $31_m$ and the potential stabilizing switch $33_m$ may be a simple switch, or may be a current source having a switching function. In the latter case, each of the driving switch $31_m$ and the potential stabilizing switch $33_m$ allows a constant current to flow therethrough when the switch is in the closed state, and does not allow a current to flow therethrough when the switch is in the open state.

Figure 2:
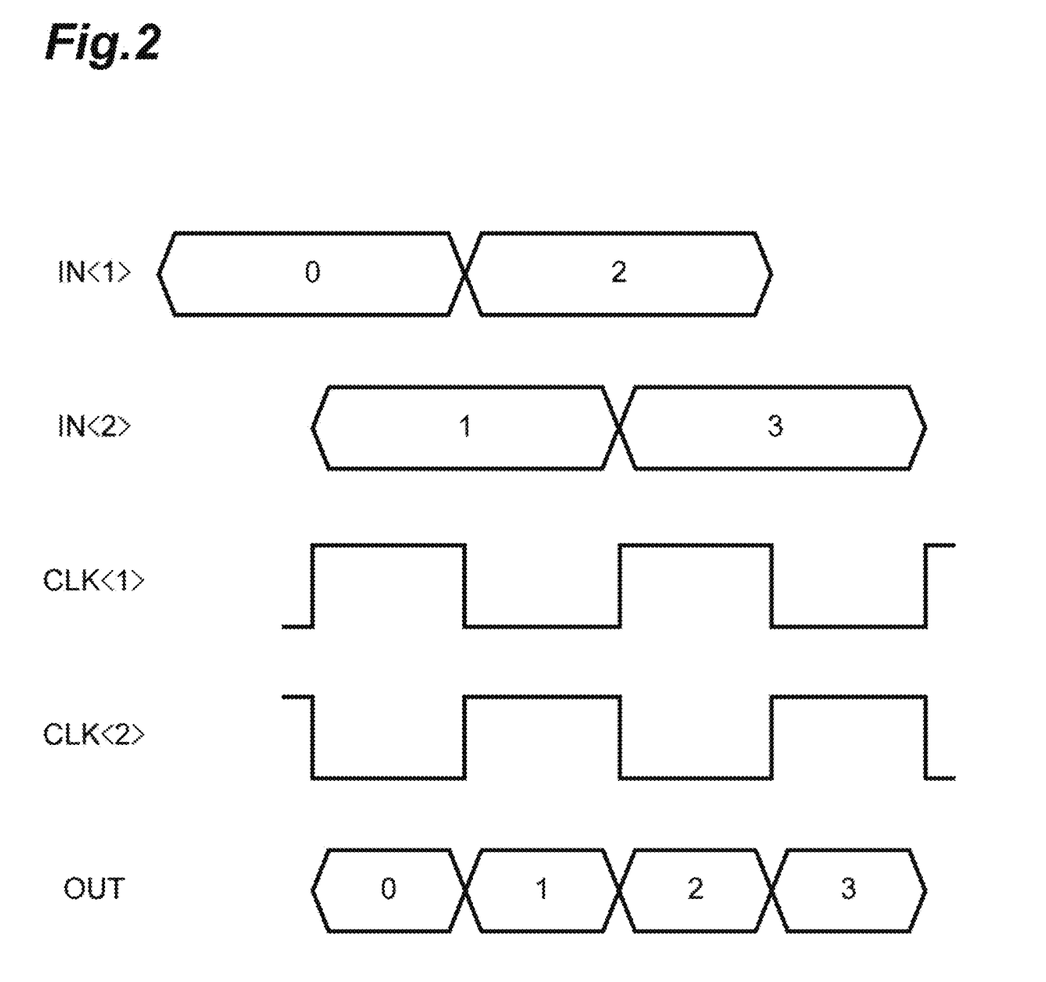
FIG. 2 is a diagram illustrating exemplary waveforms of input and output signals in the signal multiplexer 1 according to the first embodiment.

FIG. 2 is a diagram illustrating exemplary waveforms of input and output signals in the signal multiplexer 1 according to the first embodiment. In FIG. 2, in order from the top, the first input signal IN<1>, the second input signal IN<2>, the first selection signal CLK<1>, the second selection signal CLK<2>, and the output signal OUT are illustrated. The two input signals IN<1>, IN<2> may be multi-phase signals that change in different phases. The two selection signals CLK<1>, CLK<2> sequentially reach the significant levels (high levels). When one of the two selection signals CLK<1>, CLK<2> is at the high level, the other is at the low level. Bit rates of the two input signals IN<1>, IN<2> and frequencies of the two selection signals CLK<1>, CLK<2> are equal to each other.

During a period that the first selection signal CLK<1> is at the high level, the second selection signal CLK<2> is at the low level. During this period, in the one first drive unit $30_1$, the selecting switch $32_m$ is in the closed state, and the potential stabilizing switch $33_m$ is in the open state. In the other second drive unit $30_2$, the selecting switch $32_m$ is in the open state, and the potential stabilizing switch $33_m$ is in the closed state. Therefore, the signal OUT output from the output terminal 14 depends on the first input signal IN<1> input to the driving switch $31_m$ of the first drive unit $30_1$.

During a period that the first selection signal CLK<1> is at the low level, the second selection signal CLK<2> is at the high level. During this period, in the one first drive unit $30_1$, the selecting switch $32_m$ is in the open state, and the potential stabilizing switch $33_m$ is in the closed state. In the other second drive unit $30_2$, the selecting switch $32_m$ is in the closed state, and the potential stabilizing switch $33_m$ is in the open state. Therefore, the signal OUT output from the output terminal 14 depends on the second input signal IN<2> input to the driving switch $31_m$ of the second drive unit $30_2$.

Now, it is assumed that the potential stabilizing switch $33_m$ is not provided in each of the drive units $30_m$. In this case, during a period that the selecting switch $32_m$ is in the open state, a level of the input signal input to the driving switch $31_m$ might be shifted or might not be shifted. In accordance with the level shift of the input signal input to the driving switch $31_m$ during the period that the selecting switch $32_m$ is in the open state, a current might flow or might not flow between the intermediate node $34_m$ and the second terminal 12. In other words, a current that flows between the intermediate node $34_m$ and the second terminal 12 is different in accordance with a waveform pattern of the input signal input to the driving switch $31_m$. Consequently, power supply noise that depends on a current pattern occurs, whereby jitter occurs in a waveform of the output signal OUT.

The signal multiplexer 1 according to the present embodiment is characterized in that the potential stabilizing switch $33_m$ is provided in each of the drive units $30_m$. Consequently, the potential stabilizing switch $33_m$ is in the closed state during the period that the selecting switch $32_m$ is in the open state, whereby a potential of the intermediate node $34_m$ is stabilized, and a current flows between the intermediate node $34_m$ and the second terminal 12 independently of the level shift of the input signal input to the driving switch $31_m$.

The power supply noise that depends on the current pattern is reduced, and the jitter in the waveform of the output signal OUT is reduced.

Figure 3:
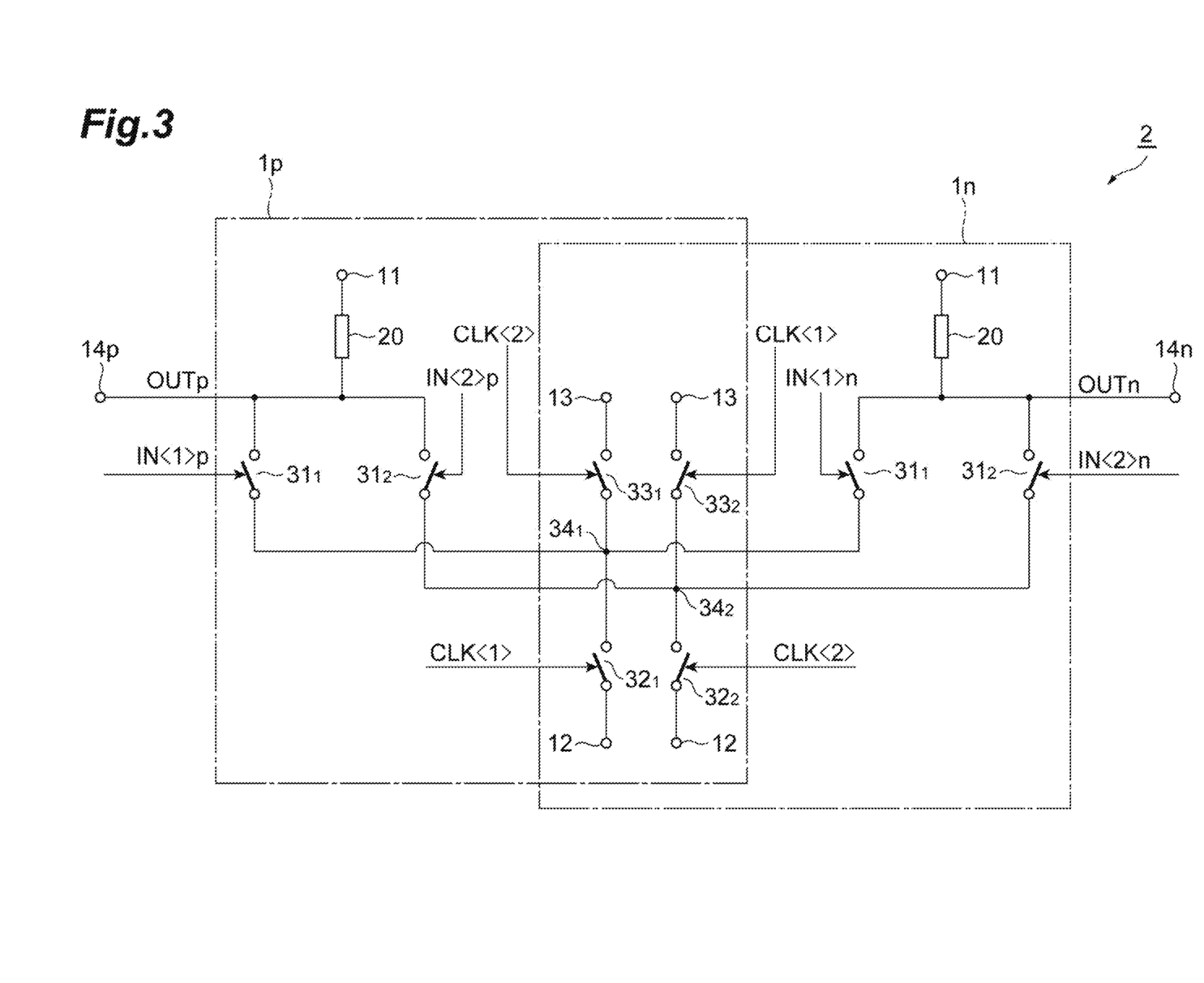
FIG. 3 is a diagram illustrating a configuration of a signal multiplexer 2 according to a second embodiment.

FIG. 3 is a diagram illustrating a configuration of a signal multiplexer 2 according to a second embodiment. The signal multiplexer 2 according to the second embodiment includes signal multiplexers 1p, 1n having configurations substantially similar to the configuration of the signal multiplexer 1 illustrated in FIG. 1. However, the signal multiplexers 1p, 1n according to the second embodiment, as compared with the configuration of the signal multiplexer 1 according to the first embodiment, is different in that each of the driving switches $31_m$ is provided between the output terminal 14 and the intermediate node $34_m$, and each of the selecting switches $32_m$ is provided between the second terminal 12 and the intermediate node $34_m$.

The signal multiplexer 2 according to the second embodiment (hereinafter referred to as a "differential signal multiplexer") inputs, as a common signal, an m-th selection signal CLK<m> that is input to the signal multiplexer 1p and an m-th selection signal CLK<m> that is input to the signal multiplexer 1n. The differential signal multiplexer 2 inputs, as a differential signal, an m-th input signal IN<m>p that is input to the signal multiplexer 1p and an m-th input signal IN<m>m that is input to the signal multiplexer 1n. The differential signal multiplexer 2 outputs, as a differential signal, a signal OUTp that is output from the output terminal 14p of the signal multiplexer 1p and a signal OUTm that is output from the output terminal 14n of the signal multiplexer 1n.

In the differential signal multiplexer 2, although the selecting switch $32_m$ of the m-th drive unit of the signal multiplexer 1p and the selecting switch $32_m$ of the m-th drive unit of the signal multiplexer 1n may be provided independently, they can be a common selecting switch $32_m$ as illustrated in FIG. 3. Similarly, although the potential stabilizing switch $33_m$ of the m-th drive unit of the signal multiplexer 1p and the potential stabilizing switch $33_m$ of the m-th drive unit of the signal multiplexer 1n may be provided independently, they can be a common potential stabilizing switch $33_m$ as illustrated in FIG. 3.

The differential signal multiplexer 2 inputs two selection signals CLK<1>, CLK<2> that sequentially reach significant levels, and inputs two differential input signals IN<1>, IN<2>. In this case, the first differential input signal IN<1> includes IN<1>p and IN<1>n, and the second differential input signal IN<2> includes IN<2>p and IN<2>n. The differential signal multiplexer 2 can output, from the output terminals 14p, 14n, a differential output signal OUT that depends on the m-th differential input signal IN<m> of the two differential input signals when the m-th selection signal CLK<m> of the two selection signals is at the significant level.

Next, a specific exemplary circuit configuration of a signal multiplexing circuit according to the present embodiment will be described. FIGS. 4 to 7 are diagrams illustrating exemplary circuit configurations of the signal multiplexer 1 according to the first embodiment. FIG. 8 is a diagram illustrating an exemplary circuit configuration of the signal multiplexer 2 according to the second embodiment. In these exemplary circuit configurations, the resistance unit 20, each of the driving switches $31_m$, each of the selecting switches $32_m$, and each of the potential stabilizing switches $33_m$ include MOS transistors. The resistance unit 20 including an MOS transistor can cause the signal multiplexer to be in a stop state when the resistance unit 20 is in an off state. When the resistance unit 20 is in an on state, the resistance unit 20 can cause the signal multiplexer to be in an operation state, and is used as a resistor having on-resistance.

Figure 4:
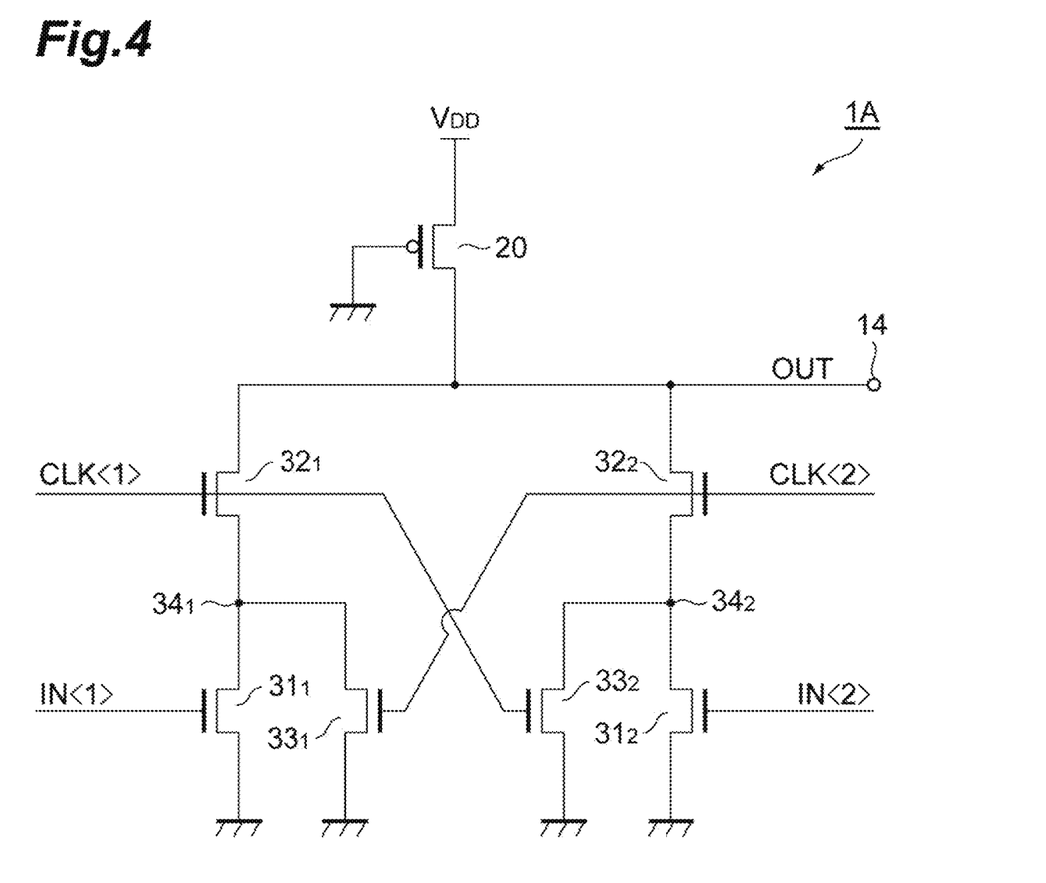
FIG. 4 is a diagram illustrating an exemplary circuit configuration of the signal multiplexer 1 according to the first embodiment.

In the signal multiplexer 1A of the first exemplary configuration illustrated in FIG. 4, the resistance unit 20 includes a PMOS transistor, and is provided between a power supply potential terminal and the output terminal 14. Each of the driving switches $31_m$ includes an NMOS transistor, and is provided between a ground potential terminal and the intermediate node $34_m$. The m-th input signal IN<m> is input to a gate terminal. Each of the selecting switches $32_m$ includes an NMOS transistor, and is provided between the output terminal 14 and the intermediate node $34_m$. The m-th selection signal CLK<m> is input to a gate terminal. Each of the potential stabilizing switches $33_m$ includes an NMOS transistor, and is provided between the ground potential terminal and the intermediate node $34_m$. The second selection signal CLK<2> is input to a gate terminal of the first potential stabilizing switch $33_1$. The first selection signal CLK<1> is input to a gate terminal of the second potential stabilizing switch $33_2$. In a case where each of the potential stabilizing switches $33_m$ includes a PMOS transistor, the first selection signal CLK<1> is input to the gate terminal of the first potential stabilizing switch $33_1$, and the second selection signal CLK<2> is input to the gate terminal of the second potential stabilizing switch $33_2$.

Figure 5:
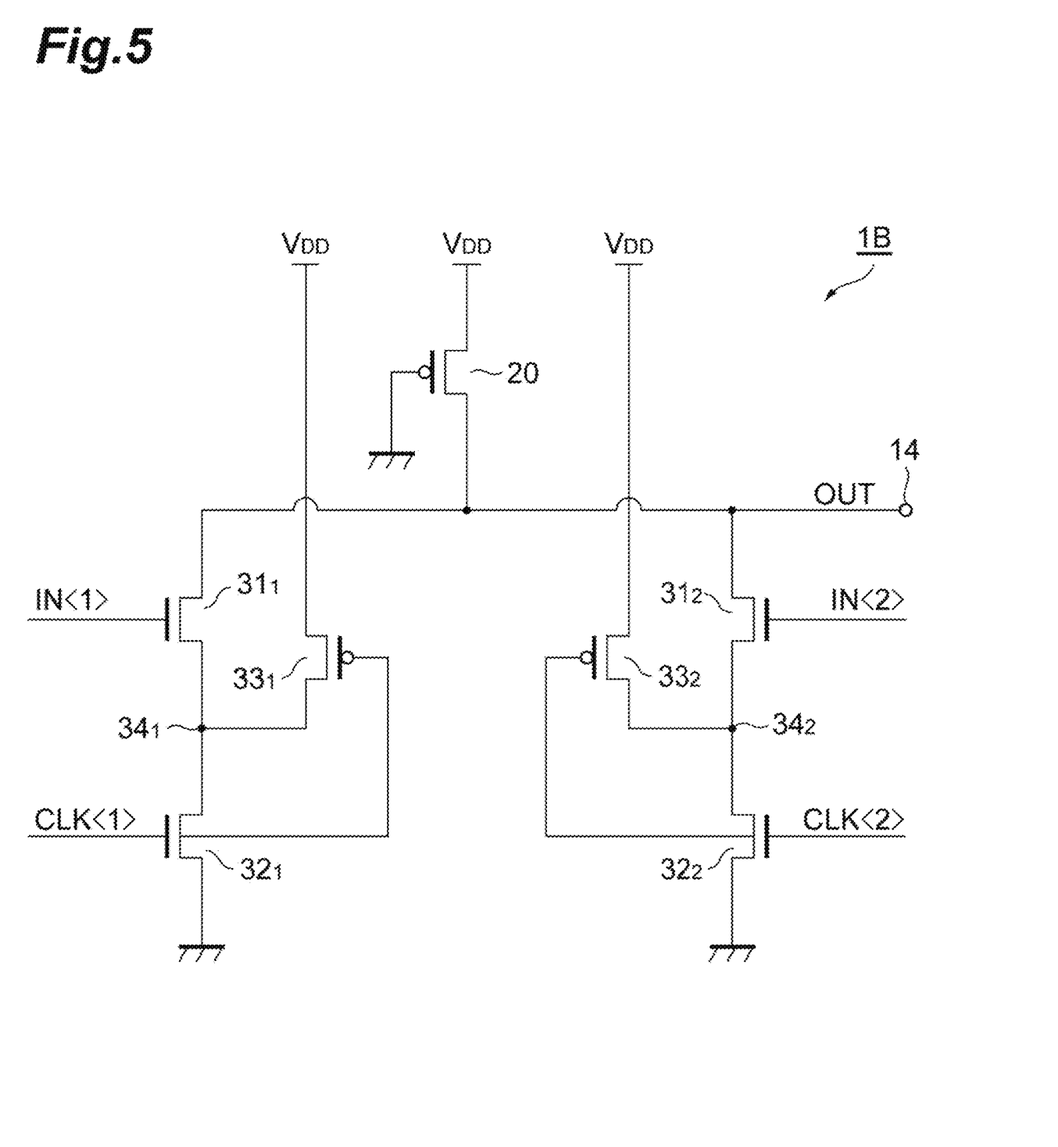
FIG. 5 is a diagram illustrating an exemplary circuit configuration of the signal multiplexer 1 according to the first embodiment.

In the signal multiplexer 1B of the second exemplary configuration illustrated in FIG. 5, the resistance unit 20 includes a PMOS transistor, and is provided between the power supply potential terminal and the output terminal 14. Each of the driving switches $31_m$ includes an NMOS transistor, and is provided between the output terminal 14 and the intermediate node $34_m$. The m-th input signal IN<m> is input to the gate terminal. Each of the selecting switches $32_m$ includes an NMOS transistor, and is provided between the ground potential terminal and the intermediate node $34_m$. The m-th selection signal CLK<m> is input to the gate terminal. Each of the potential stabilizing switches $33_m$ includes a PMOS transistor, and is provided between the power supply potential terminal and the intermediate node $34_m$. The m-th selection signal CLK<m> is input to the gate terminal. In a case where each of the potential stabilizing switches $33_m$ includes an NMOS transistor, the second selection signal CLK<2> is input to the gate terminal of the first potential stabilizing switch $33_1$, and the first selection signal CLK<1> is input to the gate terminal of the second potential stabilizing switch $33_2$.

Figure 6:
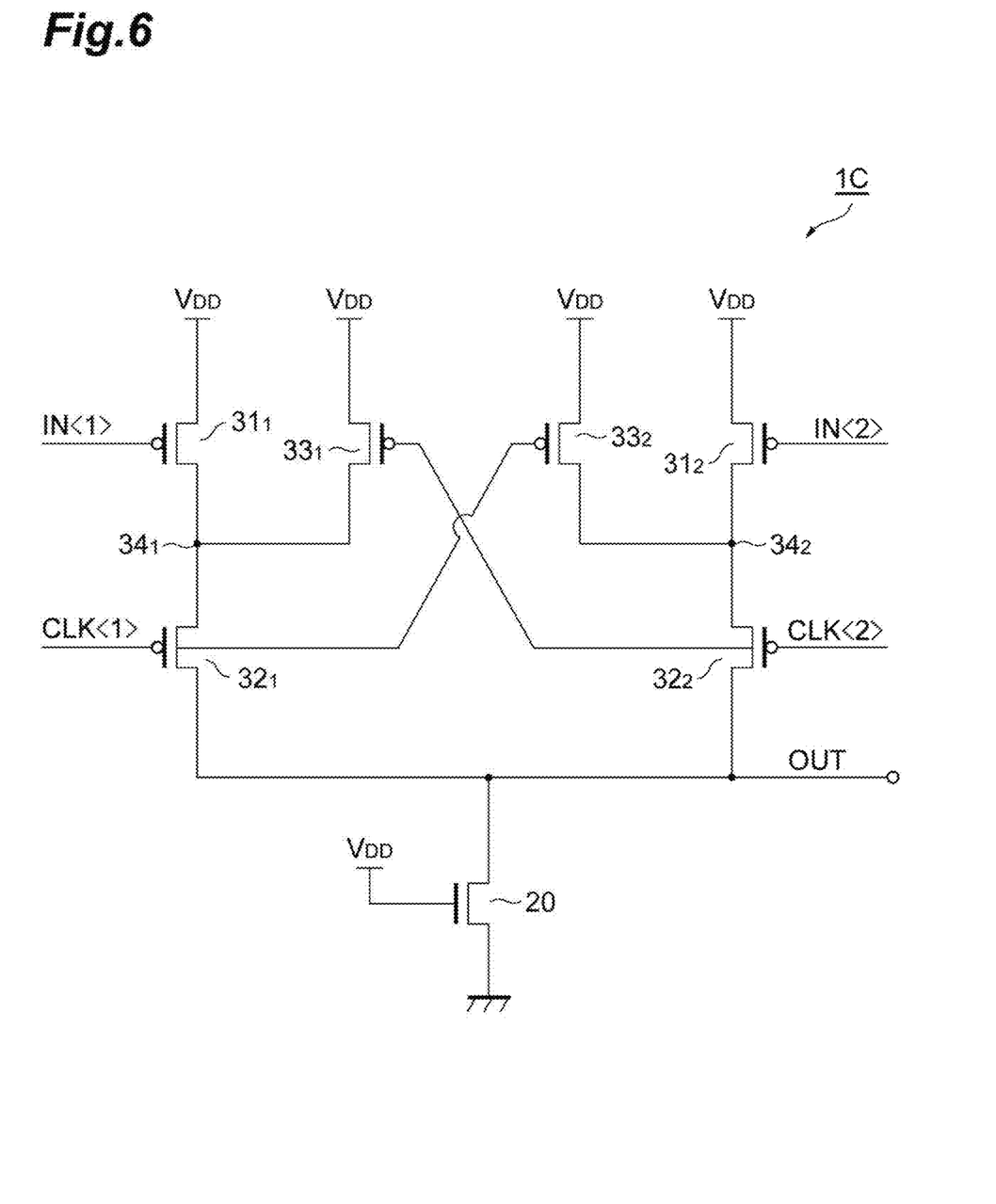
FIG. 6 is a diagram illustrating an exemplary circuit configuration of the signal multiplexer 1 according to the first embodiment.

In the signal multiplexer 1C of the third exemplary configuration illustrated in FIG. 6, the resistance unit 20 includes an NMOS transistor, and is provided between the ground potential terminal and the output terminal 14. Each of the driving switches $31_m$ includes a PMOS transistor, and is provided between the power supply potential terminal and the intermediate node $34_m$. The m-th input signal IN<m> is input to the gate terminal. Each of the selecting switches $32_m$ includes a PMOS transistor, and is provided between the output terminal 14 and the intermediate node $34_m$. The m-th selection signal CLK<m> is input to the gate terminal. Each of the potential stabilizing switches $33_m$ includes a PMOS transistor, and is provided between the power supply potential terminal and the intermediate node $34_m$. The second selection signal CLK<2> is input to the gate terminal of the first potential stabilizing switch $33_1$. The first selection signal CLK<1> is input to the gate terminal of the second potential stabilizing switch $33_2$. In a case where each of the potential stabilizing switches $33_m$ includes an NMOS transistor, the first selection signal CLK<1> is input to the gate terminal of the first potential stabilizing switch $33_1$, and the second selection signal CLK<2> is input to the gate terminal of the second potential stabilizing switch $33_2$.

Figure 7:
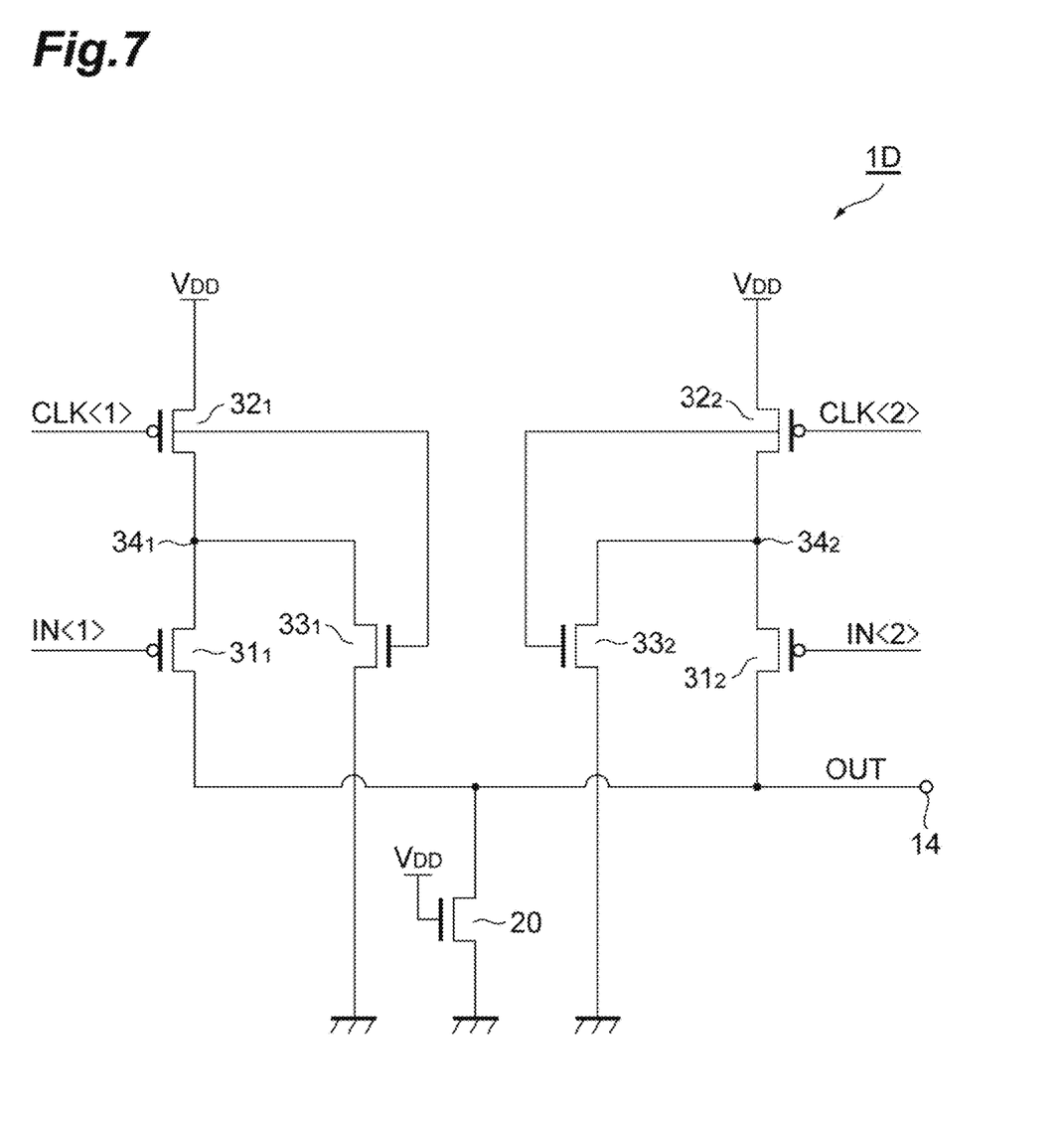
FIG. 7 is a diagram illustrating an exemplary circuit configuration of the signal multiplexer 1 according to the first embodiment.
Figure 8:
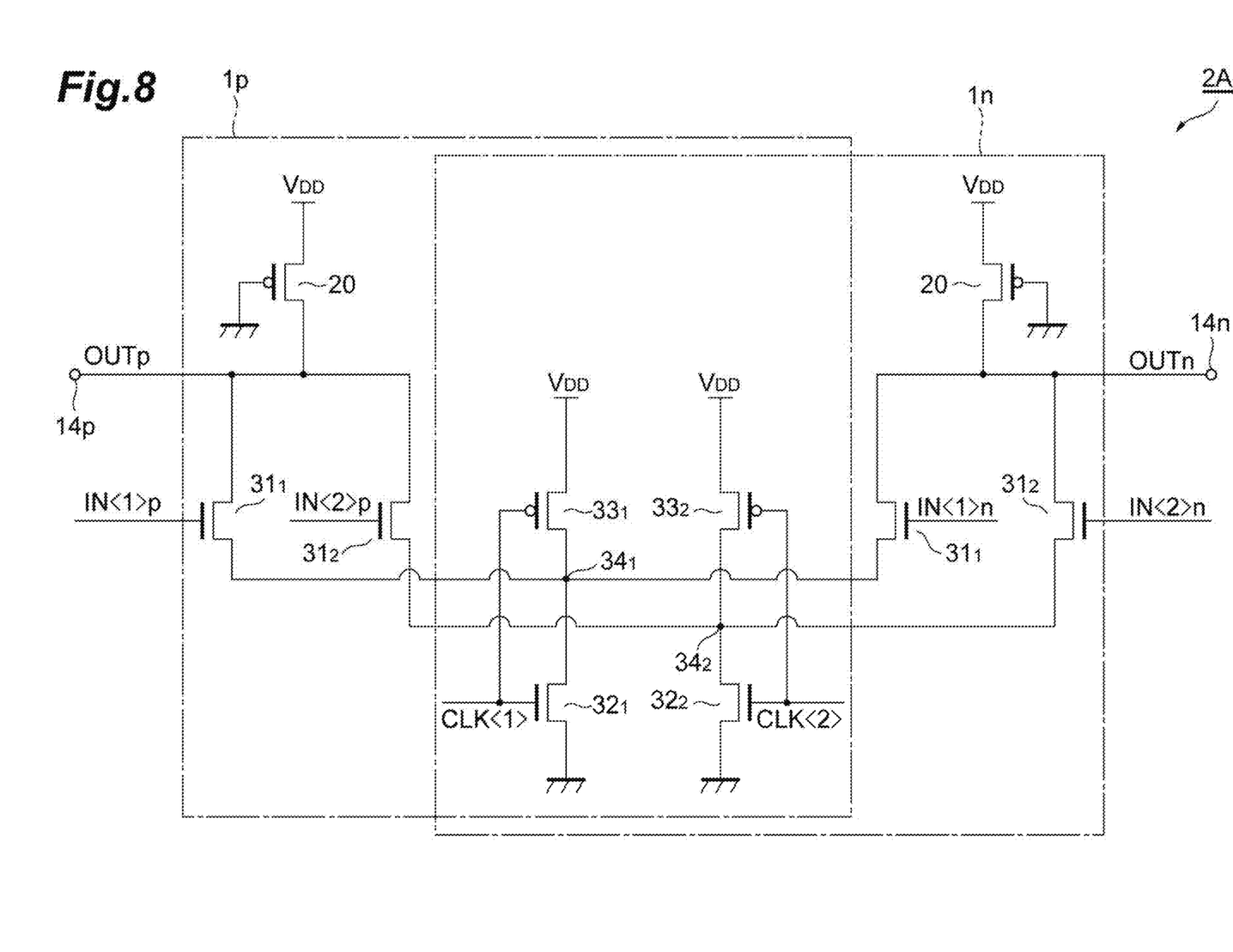
FIG. 8 is a diagram illustrating an exemplary circuit configuration of the signal multiplexer 2 according to the second embodiment.

In the signal multiplexer 1D of the fourth exemplary configuration illustrated in FIG. 7, the resistance unit 20 includes an NMOS transistor, and is provided between the ground potential terminal and the output terminal 14. Each of the driving switches $31_m$ includes a PMOS transistor, and is provided between the output terminal 14 and the intermediate node $34_m$. The m-th input signal IN<m> is input to the gate terminal. Each of the selecting switches $32_m$ includes a PMOS transistor, and is provided between the power supply potential terminal and the intermediate node $34_m$. The m-th selection signal CLK<m> is input to the gate terminal. Each of the potential stabilizing switches $33_m$ includes an NMOS transistor, and is provided between the ground potential terminal and the intermediate node $34_m$. The first selection signal CLK<1> is input to the gate terminal of the first potential stabilizing switch $33_1$. The second selection signal CLK<2> is input to the gate terminal of the second potential stabilizing switch $33_2$. In a case where each of the potential stabilizing switches $33_m$ includes a PMOS transistor, the second selection signal CLK<2> is input to the gate terminal of the first potential stabilizing switch $33_1$, and the first selection signal CLK<1> is input to the gate terminal of the second potential stabilizing switch $33_2$.

In the differential signal multiplexer 2A of the exemplary configuration illustrated in FIG. 8, in each of the signal multiplexers 1p, 1n, the resistance unit 20 includes a PMOS transistor, and is provided between the power supply potential terminal and the output terminal 14. Each of the driving switches $31_m$ includes an NMOS transistor, and is provided between the output terminal 14 and the intermediate node $34_m$. The m-th input signal IN<m> is input to the gate terminal. Each of the selecting switches $32_m$ includes an NMOS transistor, and is provided between the ground potential terminal and the intermediate node $34_m$. The m-th selection signal CLK<m> is input to the gate terminal. Each of the potential stabilizing switches $33_m$ includes a PMOS transistor, and is provided between the power supply potential terminal and the intermediate node $34_m$. The m-th selection signal CLK<m> is input to the gate terminal.

Figure 9A:
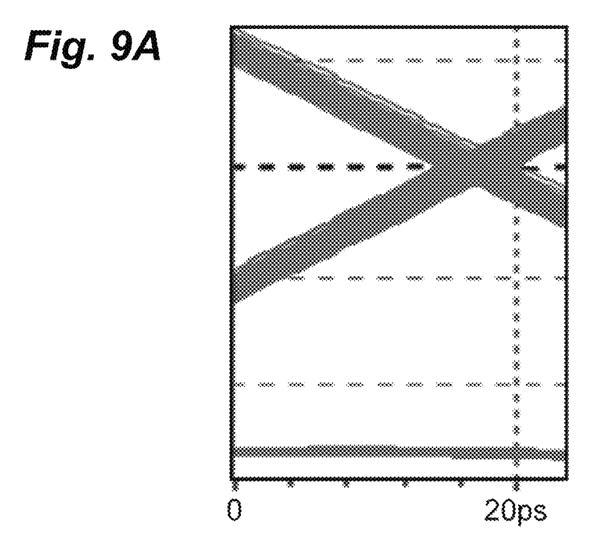
FIGS. 9A and 9B are diagrams illustrating a simulation result.
Figure 9B:
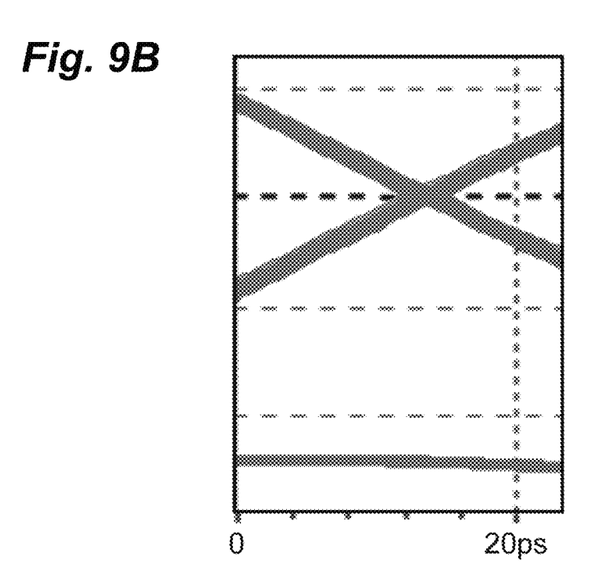

Next, a result of a simulation performed in the signal multiplexer 1A of the first exemplary configuration illustrated in FIG. 4 will be described. FIGS. 9A and 9B are diagrams illustrating the simulation result. FIG. 9A is a diagram illustrating a waveform of an output signal OUT of a comparative example in which the potential stabilizing switch $33_m$ is not provided. FIG. 9B is a diagram illustrating a waveform of an output signal OUT of an example in which the potential stabilizing switch $33_m$ is provided. A bit rate of the output signal OUT was 6 Gbps. In the comparative example, jitter in the output signal waveform was 0.04 unit interval (UI). In the example, on the other hand, jitter in the output signal waveform was 0.02 UI. As described above, the jitter in the output signal waveform was reduced by half when the potential stabilizing switch $33_m$ was provided.

The present invention is not limited to the above-mentioned embodiments, and can be modified in a variety of ways. For example, the specific exemplary circuit configuration is not limited to the above-mentioned exemplary configurations, and a variety of aspects can be employed. Although the above-mentioned embodiments have described that the number of drive units M is assumed to be two, the number of drive units M may be equal to or more than three.

INDUSTRIAL APPLICABILITY

The present invention can be applied to a use for a signal multiplexer capable of reducing jitter in an output signal waveform.

REFERENCE SIGNS LIST 1, 2 signal multiplexer
11 first terminal
12 second terminal
13 third terminal
14 output terminal
20 resistance unit
30 drive unit
31 driving switch
32 selecting switch
33 potential stabilizing switch
34 intermediate node.

The invention claimed is:

1. A signal multiplexer that inputs M selection signals that sequentially reach significant levels, inputs M input signals, and outputs a signal that depends on an m-th input signal of the M input signals when an m-th selection signal of the M selection signals is at the significant level, the signal multiplexer comprising:
   a first terminal to which a first reference fixed potential is applied;
   a second terminal to which a second reference fixed potential that is different from the first reference potential is applied;
   a third terminal to which a third reference fixed potential is applied;
   a resistance unit provided between the first terminal and an output terminal and having a resistance component; and
   M drive units provided in parallel between the second terminal and the output terminal, wherein
   each m-th drive unit of the M drive units includes:
      a driving switch that opens and closes in accordance with a level of the m-th input signal of the M input signals;
      a selecting switch that is in a closed state when the m-th selection signal of the M selection signals is at the significant level; and
      a potential stabilizing switch that is in a closed state when the m-th selection signal is at an insignificant level,
      one of the driving switch and the selecting switch is provided between the output terminal and an intermediate node, and the other of the driving switch and the selecting switch is provided between the second terminal and the intermediate node,
      the potential stabilizing switch is provided between the third terminal and the intermediate node, and
      M is an integer of two or more, and m is each integer of one or more to M to less.

2. The signal multiplexer according to claim 1 comprising two sets of the resistance unit and the M drive units, wherein
   the signal multiplexer inputs, as a common signal, an m-th selection signal that is input to the m-th drive unit of a first set of the two sets and an m-th selection signal that is input to the m-th drive unit of a second set,
   the signal multiplexer inputs, as a differential signal, an m-th input signal that is input to the m-th drive unit of the first set and an m-th input signal that is input to the m-th drive unit of the second set, and the signal multiplexer outputs, as a differential signal, a signal that is output from the output terminal of the first set and a signal that is output from the output terminal of the second set.

3. The signal multiplexer according to claim 2, wherein the selecting switch of the m-th drive unit of the first set and the selecting switch of the m-th drive unit of the second set are a common selecting switch.

4. The signal multiplexer according to claim 2, wherein the potential stabilizing switch of the m-th drive unit of the first set and the potential stabilizing switch of the m-th drive unit of the second set are a common potential stabilizing switch.

5. The signal multiplexer according to claim 3, wherein the potential stabilizing switch of the m-th drive unit of the first set and the potential stabilizing switch of the m-th drive unit of the second set are a common potential stabilizing switch.

* * * * *